US012293806B2

(12) United States Patent
Pulluru et al.

(10) Patent No.: US 12,293,806 B2
(45) Date of Patent: May 6, 2025

(54) STATIC RANDOM-ACCESS MEMORY (SRAM) APPARATUS AND METHOD FOR REDUCING WIRE DELAY

(71) Applicant: Samsung Electronics Co., Ltd., Suwon-si (KR)

(72) Inventors: Lava Kumar Pulluru, Bengaluru (IN); Gopi Sunanth Kumar Gogineni, Bengaluru (IN); Manish Chandra Joshi, Bengaluru (IN); Pushp Khatter, Bengaluru (IN)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 151 days.

(21) Appl. No.: 18/051,142

(22) Filed: Oct. 31, 2022

(65) Prior Publication Data

US 2024/0071438 A1 Feb. 29, 2024

(30) Foreign Application Priority Data

Aug. 30, 2022 (IN) .............................. 202241049601

(51) Int. Cl.
*G11C 7/10* (2006.01)
*G11C 7/12* (2006.01)
*G11C 7/22* (2006.01)

(52) U.S. Cl.
CPC ................ *G11C 7/109* (2013.01); *G11C 7/12* (2013.01); *G11C 7/22* (2013.01)

(58) Field of Classification Search
CPC .............................................. G11C 11/41–419
See application file for complete search history.

(56) References Cited

U.S. PATENT DOCUMENTS

| 4,758,988 A | * | 7/1988 | Kuo ......................... G11C 7/00 365/185.11 |
| 5,933,387 A | * | 8/1999 | Worley .................... G11C 8/14 365/189.11 |
| 9,076,505 B2 | | 7/2015 | Atsumi et al. |
| 9,466,355 B2 | | 10/2016 | Ting et al. |
| 9,940,996 B1 | | 4/2018 | Pelley |
| 10,304,507 B2 | | 5/2019 | Joshi et al. |

* cited by examiner

Primary Examiner — Alfredo Bermudez Lozada
(74) Attorney, Agent, or Firm — Harness, Dickey & Pierce, P.L.C.

(57) ABSTRACT

Various example embodiments of the inventive concepts include a SRAM apparatus including a left memory array and right memory array, each of the left memory array and the right memory array including a left memory array and a right memory array, each comprising a plurality of columns, the plurality of columns in each of the left memory array and the right memory array divided into a plurality of segments, and each of the segments comprising a plurality of memory bit cells, and central driver circuitry comprising a plurality of driver devices, each of the plurality of driver devices communicatively connected to a corresponding segment of the plurality of segments through a corresponding metal control line of a plurality of metal control lines, the central driver circuitry configured to route at least one array signal to at least one segment of the plurality of segments.

15 Claims, 6 Drawing Sheets

STATIC RANDOM-ACCESS MEMORY (SRAM) APPARATUS AND METHOD FOR REDUCING WIRE DELAY

CROSS-REFERENCE TO RELATED APPLICATION

This application claims priority under 35 U.S.C. § 119 to Indian Patent Application No. 202241049601, filed on Aug. 30, 2022, in the Indian Intellectual Property Office, the disclosure of which is incorporated herein in its entirety by reference.

BACKGROUND

Various example embodiments of the inventive concepts generally relate to the field of Static Random-Access Memory (SRAM), and more particularly but not exclusively, the one or more example embodiments of the inventive concepts relate to an SRAM apparatus, a system including the SRAM apparatus, and/or a method of operating and/or designing the SRAM apparatus for reducing wire delay, etc.

Generally, the reduction in wire delays is much less than and/or reduced in comparison to the reduction in gate delays reduction with technology scaling in Static Random-Access Memory (SRAMs). Due to this reason, the wire delays of desired and/or critical signals, such as Word Line (WL), self time signals, and the like, have become a significant aspect in determining the overall performance of an SRAM memory device and/or memory apparatus, etc. In conventional SRAM devices, as shown in FIG. 1A, a critical signal such as WL, is driven by the WL Driver (DRVR), and the WL signal is routed across the memory array. To reduce parasitic resistance and/or capacitance delay (also referred as RC delay) in metal wires, the WL is routed using two metal layers, such as M2 and M3, as shown in the FIG. 1A. However, when the size of the memory device is large (e.g., the memory capacity is large, etc.), the length of WL will consequently be large, and additionally, the loading due to the memory bit cells will be high. Therefore, though there are two metal layers for routing WL, the delay and slope of WL at the far end of the memory array is still very high.

Reducing wire delay while routing desired and/or critical signals to all and/or some of the segments and/or routes in an SRAM is desired and/or crucial to achieve improved and/or optimized performance and robustness. In some other existing, conventional SRAMs, multiple drivers (also referred to as repeaters) are used as buffers to route the desired and/or critical signals via multiples segments and/or routes in the SRAM. The conventional SRAM routing method consists of a signal buffering scheme for array and periphery signals. The conventional method splits each of the memory array into two segments and inserts buffer repeaters/drivers for each segment as shown in FIG. 1B. FIG. 1B illustrates a row-decoder that includes multiple repeaters between each segment, to ensure reachability of the critical signals to memory bit cells in the far end of the memory arrays. As shown in the FIG. 1B, the existing SRAM of the related art would include multiple drivers indicated by reference numeral 101 and additional drivers 102, 103 as buffers to ensure the critical signals reach the far end of the memory array. However, this structure of SRAM may increase a delay in routing the signal when the memory size is large and/or when there is significant logic gate delay. Moreover, multiple and/or numerous drivers used in an SRAM device introduces a number of disadvantages, such as increasing the number of hardware resources used for transmitting the critical signals to the memory bit cells in each segment of the SRAM, increasing the complexity of the design structure within the SRAM, increasing the power consumption of the SRAM, and/or increasing the physical size of the SRAM, etc.

The information disclosed in this background section is only for enhancement of understanding of the general background of the example embodiments and should not be taken as an acknowledgement or any form of suggestion that this information forms prior art already known to a person skilled in the art.

SUMMARY

One or more shortcomings of conventional SRAM devices and/or systems are overcome by one or more of the devices, systems and/or methods of the example embodiments and additional advantages are provided through the provision of devices, systems, and/or methods as disclosed in one or more of the example embodiments of the inventive concepts. Additional features and advantages are realized through the techniques of one or more of the example embodiments of the inventive concepts. Other example embodiments and aspects of the inventive concepts are described in detail herein and are considered a part of the claimed disclosure.

At least one example embodiment discloses a Static Random-Access Memory (SRAM) apparatus for reducing wire delay. The SRAM apparatus comprises a left memory array and a right memory array, each comprising a plurality of columns, the plurality of columns in each of the left memory array and the right memory array divided into a plurality of segments, and each of the segments comprising a plurality of memory bit cells. Further, the SRAM apparatus comprises central driver circuitry comprising a plurality of driver devices, each of the plurality of driver devices communicatively connected to a corresponding segment of the plurality of segments through a corresponding metal control line of a plurality of metal control lines, the central driver circuitry configured to route at least one array signal to at least one segment of the plurality of segments.

At least one example embodiment discloses a method of operating an SRAM apparatus for reducing wire delay. The SRAM apparatus comprises wherein the SRAM apparatus comprises a left memory array and a right memory array, the left memory array and the right memory array both including a plurality of columns. The method comprises receiving, by each of a plurality of driver devices included in central driver circuitry included in the SRAM apparatus, a subset of array signals of a plurality of array signals to be routed to at least one segment of a plurality of segments of the left memory array and the right memory array, based on a unique load value of a plurality of unique load values, each of the unique load values corresponding to a driver device of the plurality of driver devices, and routing, by each of the plurality of driver devices, the subset of array signals driven by each of the plurality of driver devices to the plurality of columns of a corresponding segment of the plurality of segments through a corresponding metal control line of a plurality of metal control lines At least one example embodiment discloses a method for designing a Static Random-Access Memory (SRAM) apparatus for reducing wire delay. The method comprises dividing, using processing circuitry, a plurality of columns in each of a left memory array and a right memory array of the SRAM apparatus into a plurality of segments using one or more edge cells, arranging, using the processing circuitry, central driver circuitry comprising a plurality of driver devices, wherein a total number of the plurality of driver devices is equal to a total number of the plurality of segments, the central driver circuitry configured to route a plurality of array signals, and connecting, using the processing circuitry, each of the plurality of driver devices to each column of the plurality of columns included in a corresponding segment of the plurality of segments, through at least one corresponding metal control line of a plurality of metal control lines.

It is to be understood that aspects of the example embodiments of the inventive concepts described herein may be used in any combination with each other. For example, several aspects and example embodiments may be combined together to form a further example embodiment of the inventive concepts.

The foregoing summary is illustrative only and is not intended to be in any way limiting. In addition to illustrative aspects, example embodiments, and features described above, further aspects, example embodiments, and features will become apparent by reference to drawings and the following detailed description.

BRIEF DESCRIPTION OF THE ACCOMPANYING FIGURES

The accompanying drawings, which are incorporated in and constitute a part of this disclosure, illustrate example embodiments and, together with the description, serve to explain the disclosed principles. In the figures, the left-most digit(s) of a reference number identifies the figure in which the reference number first appears. The same numbers are used throughout the figures to reference like features and components. Some example embodiments of system and/or methods in accordance with various example embodiments of the inventive concepts are now described, by way of example only, and with reference to the accompanying figures, in which:

FIG. 1A (related art) and FIG. 1B (related art) illustrate conventional Static Random-Access Memory (SRAM) structures in accordance with the related art;

Figure 1A:
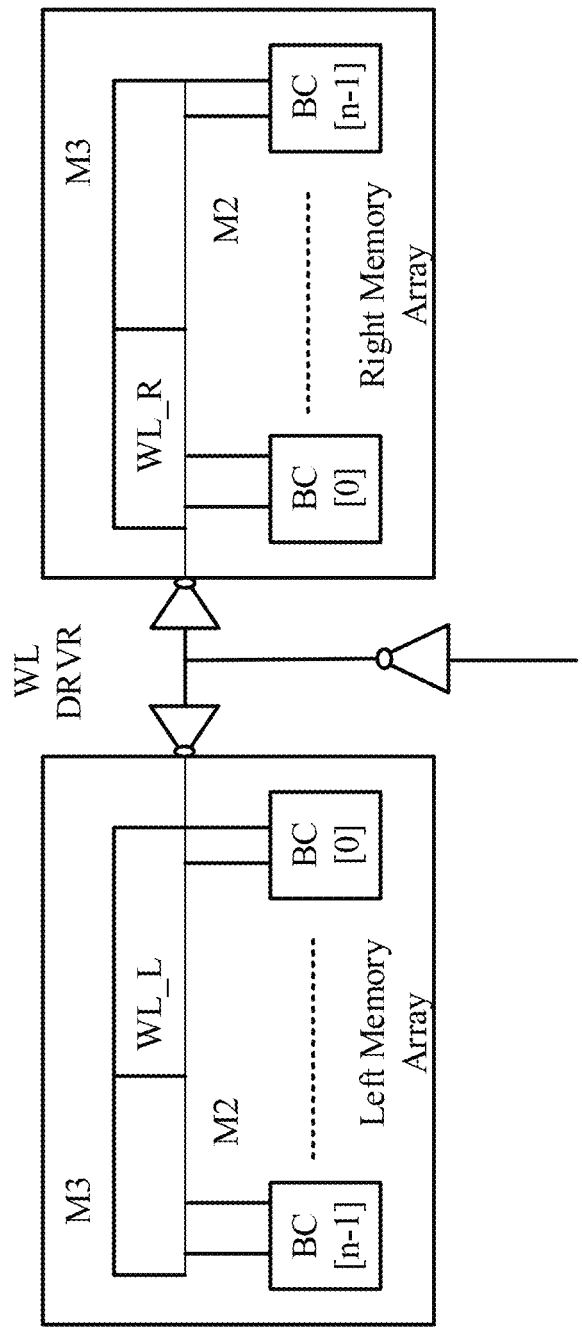
Figure 1B:
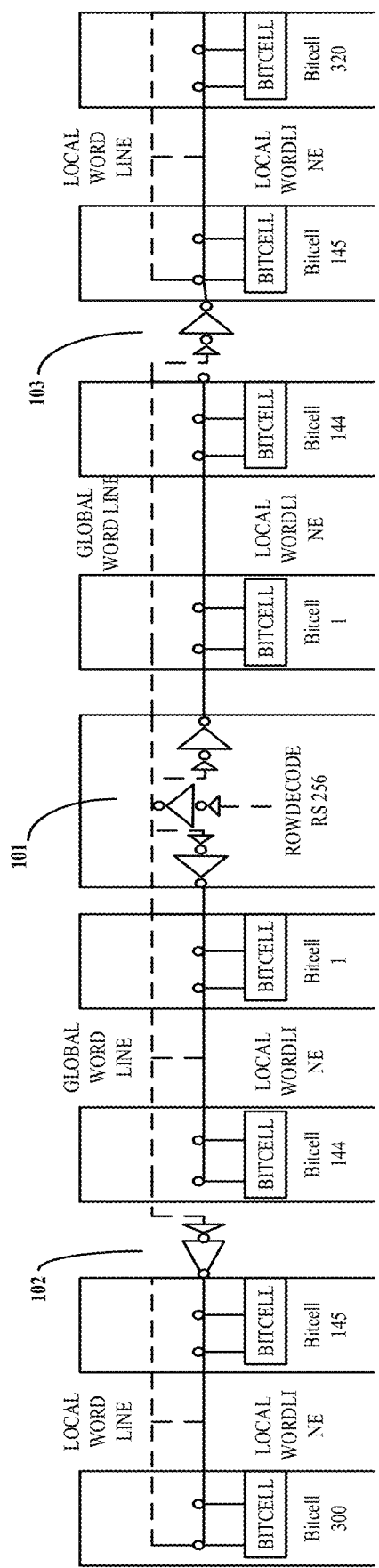

It should be appreciated by those of ordinary skill in the art that any block diagrams herein represent conceptual views of illustrative systems embodying the principles of one or more of the example embodiments of the inventive concepts. Similarly, it will be appreciated that any flow charts, flow diagrams, state transition diagrams, pseudo code, and the like represent various processes which may be substantially represented in a non-transitory computer readable medium and executed by a computer, processing circuitry, and/or processor, whether or not such computer, processing circuitry, and/or processor is explicitly shown.

The figures depict various example embodiments of the inventive concepts for purposes of illustration only. One of ordinary skill in the art will readily recognize from the following description that alternative example embodiments of the system illustrated herein may be employed without departing from the principles of the inventive concepts described herein.

DETAILED DESCRIPTION

In the present document, the word "exemplary" is used herein to mean "serving as an example, instance, or illustration." Any example embodiment or implementation of the inventive concepts described herein as "exemplary" is not necessarily be construed as preferred or advantageous over other example embodiments.

While the example embodiments of the inventive concepts are compatible with various modifications and alternative forms, specific example embodiments thereof have been shown by way of example in the drawings and will be described in detail below. It should be understood, however that the example embodiments discussed herein are not intended to limit the inventive concepts to the forms disclosed, but on the contrary, the inventive concepts cover all modifications, equivalents, and alternatives falling within the scope of the inventive concepts.

The terms "comprises", "comprising", "includes" or any other variations thereof, are intended to cover a non-exclusive inclusion, such that a setup, device, system, and/or method that includes a list of components or steps does not include only those components or steps but may include other components or steps not expressly listed or inherent to such setup, device, system, and/or method. In other words, one or more elements in a system and/or apparatus proceeded by "comprises . . . a" does not, without more constraints, preclude the existence of other elements or additional elements in the device, system, and/or method, etc.

Various example embodiments are directed towards Static Random-Access Memory (SRAM) apparatuses, systems including the SRAM apparatus, methods of operating and/or designing the SRAM apparatus for reducing wire delay, etc. SRAM is a type of RAM that uses latching circuitry (e.g., flip-flops) to store each bit of data. However, the techniques of the example embodiments of the inventive concepts are not limited to SRAM, but may also be applied to Read Only Memory (ROM), register file, and the like, but are not limited thereto. SRAM is used in personal computers, workstations, routers and peripheral equipment, CPU register files, internal CPU caches and external burst mode SRAM caches, hard disk buffers, router buffers, and the like, but are not limited thereto. At least one example embodiment of the inventive concepts discloses SRAM apparatus that includes a left memory array and a right memory array containing plurality of columns of memory bit cells, however the example embodiments are not limited thereto, and for example, the SRAM apparatus may include a greater or lesser number of memory arrays, etc. In some example embodiments, the plurality of memory bit cells may be used to store data. More specifically, in some example embodiments, the plurality of columns of memory bit cells in each of the left memory array and the right memory array are divided into a plurality of segments, and each of the segment comprises of plurality of memory bit cells. Further, a central driver (e.g., central driver circuitry, etc.) comprises a plurality of driver units and/or driver devices (e.g., write driver circuitry, word line driver circuitry, etc.) arranged in such a way that the number of plurality of driver units is equal to the total number of the plurality of segments, but the example embodiments are not limited thereto. The plurality of driver units are communicatively connected to the plurality of segments through a corresponding plurality of metal control lines configured to route array signals. In some example embodiments, the plurality of columns of memory bit cells in each of the left memory array and the right memory array are divided into the plurality of segments using one or more edge cells, but are not limited thereto. Since each of the plurality of segments have dedicated driver units, transmission of array signals becomes faster even when the memory size is large, thus, reducing the wire delay in SRAM devices.

In some example embodiments, the array signals carried by the plurality of metal control lines arranged at a higher metallic (and/or metal) layer, may be routed to the plurality of columns of memory bit cells of the corresponding segment by tapping through each of the plurality of metal control lines at lower metallic (and/or metal) layers compared to the higher metallic (and/or metal) layer, in a descending manner. The conductivity of each of the plurality of metal control lines may vary based on the distance of each of the plurality of segments from the central driver and a metallic (and/or metal) layer of the metal control line. Each metal control line has multiple metallic wires at the same level and/or layer which carry one or more of the array signals. However, the thickness of each of the plurality of metal control lines may also vary based on the distance of each of the plurality of segments from the central driver and a metallic (and/or metal) layer of the metal control line.

Various example embodiments of the inventive concepts aim to reduce the wire delay in SRAM devices. The central driver used in at least one example embodiment of the inventive concepts may include a plurality of driver units, the number of which may be precisely equal to the total number of the segments in each memory array, but the example embodiments are not limited thereto. Hence, the amount of coupling between segments becomes less and/or decreased. As a result, at least one example embodiment of the inventive concepts helps in achieving better and/or improved word line slew rate and/or reduces delay, etc. By using the SRAM apparatus disclosed in one or more of the example embodiments of the inventive concepts, the Inventors have determined through experiments that performance of SRAM can be improved by approximately 5-7%, but is not limited thereto.

A description of at least one example embodiment with several components in communication with each other does not imply that all such components are desired and/or required. On the contrary, a variety of optional components are described to illustrate the wide variety of possible additional example embodiments of the inventive concepts.

In the following detailed description of the example embodiments of the inventive concepts, reference is made to the accompanying drawings that form a part hereof, and in which are shown by way of illustration specific example embodiments in which the inventive concepts may be practiced. These example embodiments are described in sufficient detail to enable those skilled in the art to practice the inventive concepts, and it is to be understood that other example embodiments may be utilized and that changes may be made without departing from the scope of the inventive concepts. The following description is, therefore, not to be taken in a limiting sense.

Figure 2:
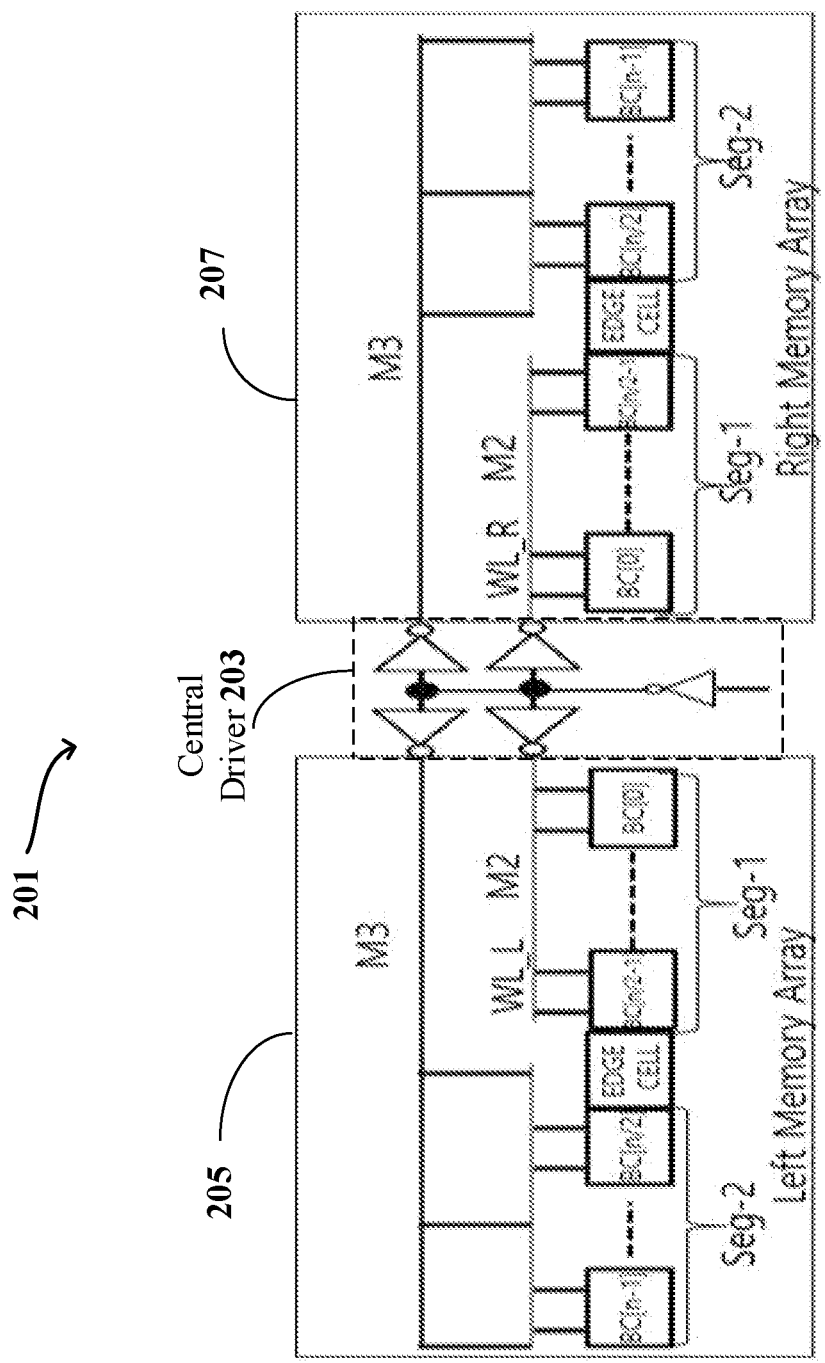
FIG. 2 illustrates an example structure of an SRAM apparatus for reducing wire delay, in accordance with some example embodiments of the inventive concepts.

FIG. 2 illustrates an example structure of an SRAM apparatus for reducing wire delay, in accordance with some example embodiments of the inventive concepts.

Referring now to FIG. 2, according to at least one example embodiment, a SRAM apparatus 201 may comprise a left memory array 205, a right memory array 207 and/or a central driver 203 (e.g., central driver circuitry, etc.), but the example embodiments are not limited thereto, and for example may include a greater or lesser number of constituent components, such as two or left memory arrays, two or more right memory arrays, a single memory array, etc. The left memory array 205 and the right memory array 207 each comprise a plurality of columns of memory bit cells, etc. As shown in the FIG. 2, the plurality of memory bit cells may be BC (0), BC (1), BC (n/2−1), BC (n/2), BC (n−1), and the like, wherein BC stands for Bit Cell. Further, the plurality of columns of memory bit cells in each of the left memory array 205 and the right memory array 207 are divided into a plurality of segments, and each segment comprises of a plurality of memory bit cells. In some example embodiments, each of the plurality of segments may be divided using one or more edge cells, e.g., one or more cells of the memory array which are arranged at the physical layout edges and/or physical boundaries of the memory array to provide physical protection to the memory bit cells of the memory array during the fabrication process and are not used to store data. As shown in the FIG. 2, left memory array 205 is divided into segment 1 and segment 2, and the right memory array 207 is also divided into segment 1 and segment 2 using an edge cell between the segments and the edge cell is not connected to a metal control line, but the example embodiments are not limited thereto. The number of segments shown in each memory array of the FIG. 2 should not be construed as a limitation of the example embodiments of the inventive concepts, and, for example, there may be more than 2 segments in each memory array, etc. In some example embodiments, the central driver 203 may include a plurality of driver units (e.g., a plurality of driver devices, a driver circuitry, a plurality of word line drivers, word line driver circuitry, write driver circuitry, etc.) wherein the number of driver units included in the central driver 203 is equal to the total number of segments in the plurality of memory arrays, e.g., the left memory array 205 and the right memory array 207, etc. In other words, the central driver 203 may include a plurality of driver units such that, each segment of the left memory array 205 and the right memory array 207 is associated with a dedicated driver unit, but the example embodiments are not limited thereto. The driver units may be responsible for routing (the terms "routing" and "transmitting" may be used interchangeably throughout the description) one or more of the plurality of array signals driven by one or more of the plurality of driver units to the plurality of columns of memory bit cells of the corresponding plurality of segments through a corresponding plurality of metal control lines, but the example embodiments are not limited thereto. In some example embodiments, the plurality of array signals may be desired and/or critical signals, such as Word Line (WL) signals, self-time signals, and the like, but the example embodiments are not limited thereto, and other signals may be included.

In some example embodiments, the plurality of driver units may be communicatively connected to their respective and/or corresponding segment of the plurality of segments through a corresponding at least one metal control line of a plurality of metal control lines for routing the plurality of array signals. Each metal control line may include multiple metallic (and/or metal) wires at the same level and/or layer which carries the one or more array signals to the memory bit cells, etc. Further, according to some other example embodiments, the plurality of metal control lines may be arranged at different metallic (and/or metal) layers, etc. In some example embodiments, each of the plurality of metal control lines in ascending order of the metallic (and/or metal) layers (e.g., from a bottom metal layer to a top metal layer) may be connected to a corresponding segment of the plurality of segments based on their distance from the central driver 203, but the example embodiments are not limited thereto. As an example, as shown in the FIG. 2, according to at least one example embodiment, the plurality of metal control lines at the metal layer M2 may be connected to segment 1 (Seg-1) of the memory array (e.g., the lowest metal layer of the SRAM device may be connected to the left and right memory array segments closest to the central driver 203), the plurality of metal control lines at the metal layer M3 may be connected to segment 2 (Seg-2) of the memory array (e.g., the next metal layer of the SRAM device may be connected to the left and right memory array segments which are the next closest to the central driver 203), etc., and this sort of ascending order connection follows until the end of all of the segments in each of the memory arrays, but the example embodiments are not limited thereto. The one or more array signals may be routed by the central driver 203 to one or more of the plurality of columns of memory bit cells of the corresponding segment by tapping, e.g., using a tap, using a via, etc., through each of the plurality of metal control lines at lower metallic layers (e.g., metal layers, etc.) compared to the higher metallic layer (e.g., metal layers, etc.) in a descending manner, but the example embodiments are not limited thereto. In other words, the metal control lines included in a first metallic layer is connected to its corresponding segment and/or plurality of columns through at least one tap in at least one second metallic layer, the at least one second metallic layer being lower than the first metallic layer.

In some example embodiments, one or more array signals may be routed from higher metallic layer (e.g., metal layers, etc.) to a descended and/or lower layer through tapping (and/or vias, etc.), but the example embodiments are not limited thereto. As an example, as shown in the FIG. 2, the array signals routed via a higher metallic layer M3, may be tapped to the lower metallic layer M2 at segment 2, which in turn may provide the array signals to the plurality of memory bit cells belonging to segment 2, etc., but is not limited thereto. Additionally, since the metallic layer M2 itself is the lowest metallic layer in FIG. 2, the array signals directly reach the plurality of memory bit cells belonging to segment 1 via the metallic layer M2, without the need for tapping, etc. In some example embodiments, the type and/or thickness of each of the plurality of metal control lines may vary based on the distance of each of the plurality of segments from the central driver 203 and/or the distance of a metallic layer to the metal control line, etc. Further, conductivity of each of the plurality of metal control lines varies based on the distance of each of the plurality of segments from the central driver 203 and/or the distance of a metallic layer to the metal control line, etc., due to an increase in resistance and/or parasitic capacitance caused by the longer distance of the metal control lines, etc. In at least one example embodiment, segments that are farther away from the central driver 203 may be connected with plurality of metal control lines of higher conductivity and thickness, compared to segments which are closer to the central driver 203 to account for an increase in resistivity and/or parasitic capacitance caused by the distance of the segment from the central driver 203, but the example embodiments are not limited thereto. In other words, according to at least one example embodiment, since segment 2 is relatively far from the central driver 203, segment 2 may be connected with plurality of metal control lines of higher conductivity and/or thickness compared to the segment 1, which is relatively closer to the central driver 203 compared to segment 2 as shown in the FIG. 2, but the example embodiments are not limited thereto.

Figure 3:
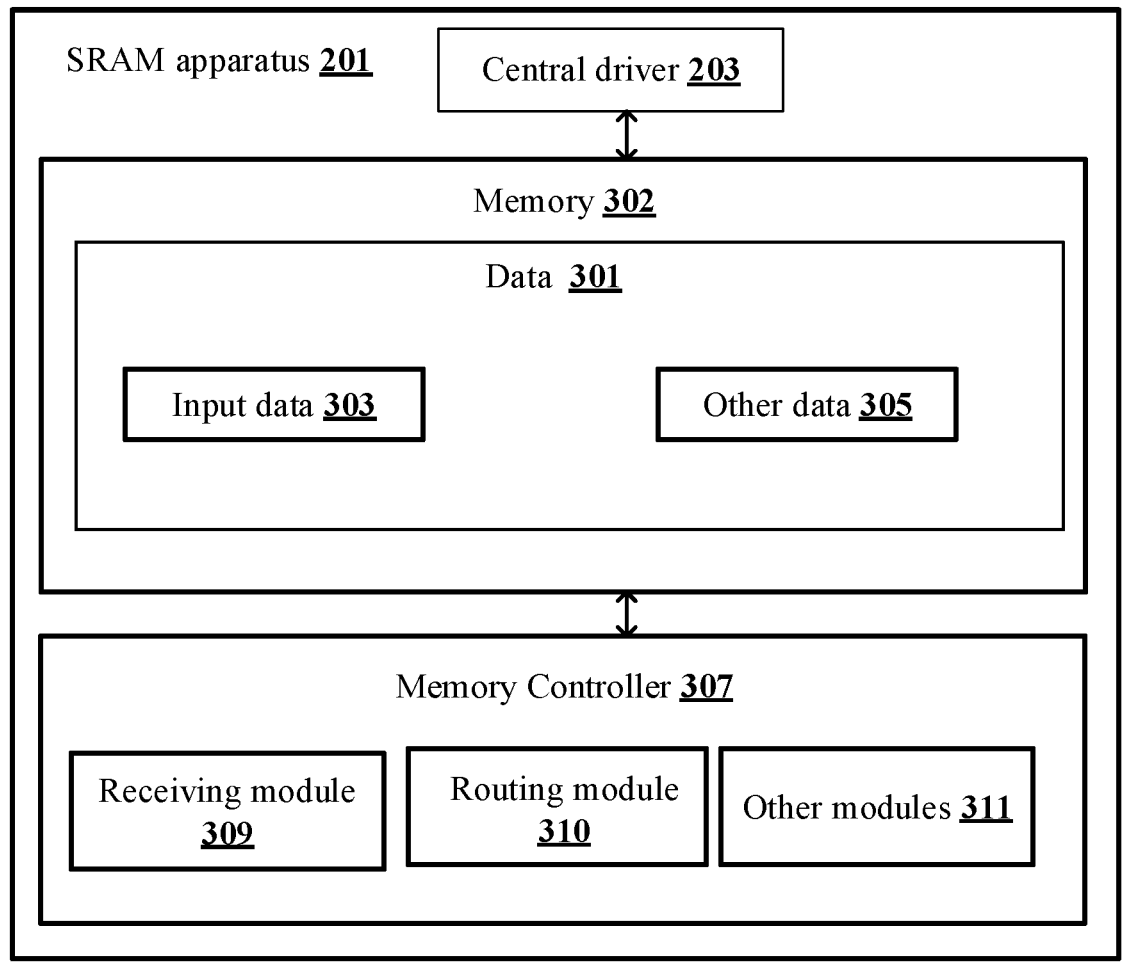
FIG. 3 shows a detailed block diagram of the SRAM apparatus for reducing wire delay, in accordance with some example embodiments of the inventive concepts.

FIG. 3 shows a detailed block diagram of the SRAM apparatus for reducing wire delay, in accordance with some example embodiments of the inventive concepts.

In some example embodiments, SRAM apparatus 201 may include a central driver 203 (e.g., central driver circuitry, etc.), memory 302 (e.g., a plurality of memory cells, etc.) and/or memory controller 307, etc., but is not limited thereto. Additionally, the SRAM apparatus may store data 301 in the memory 302, etc. As an example, the data 301 is stored in memory 302 of SRAM 201 as shown in the FIG. 3. In at least one example embodiment, the data 301 may include input data 303 and/or other data 305, etc. The memory controller 307 will be described in further detail below.

In some example embodiments, the data 301 may be stored in the memory 302 in the form of various data structures, but are not limited thereto. Additionally, the data 301 may be organized using data models, such as relational and/or hierarchical data models, etc. The other data 305 may store data, including temporary data and/or temporary files, etc., generated by the memory controller 307 for performing the various functions of the SRAM apparatus 201, but the example embodiments are not limited thereto.

In some example embodiments, the data 301 stored in the memory 302 may be processed by the central driver 203, the memory controller 307, and/or one or more of the sub-modules of the memory controller 307, etc., but the example embodiments are not limited thereto. The memory controller 307 may be stored within the memory 302. In at least one example embodiment, the memory controller 307 is communicatively coupled to the central driver 203, may also be present outside (e.g., external to) the memory 302, as shown in FIG. 3, and implemented as hardware, etc., but the example embodiments are not limited thereto, and for example, the memory controller 307 may be included in the central driver 203, etc. According to some example embodiments, the central driver 203, memory controller 307, receiving module 308, routing module 310, and/or the other modules 311, etc., may be implemented as processing circuitry. The processing circuitry may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In some example embodiments, the memory controller 307 may include, for example, a receiving module 309, a routing module 310, and/or other modules 311, etc., but are not limited thereto. The other modules 311 may be used to perform various miscellaneous functionalities of the SRAM 201, but are not limited thereto. It will be appreciated that the aforementioned sub-modules of the memory controller 307 may be represented as a single module or a combination of different modules, etc.

In some example embodiments, the receiving module 309 may receive one or more signals of the plurality of array signals to be routed to one or more segments of the plurality of segments of the left memory array 205 and/or the right memory array 207, etc., corresponding to one or more of the plurality of driver units that may be communicatively connected to the plurality of segments through a corresponding plurality of metal control lines for routing the array signals. The input data 303 may refer to desired and/or critical signals and/or array signals received by the receiving module 309 for routing, etc. Examples of some desired and/or critical signals may include, but are not limited to, a Pre-charge signal (PCH), a Sense Amplifier Enable Signal (SAEN), a Latch Clock, a Sense Bitline Pre-charge signal, etc., but the example embodiments are not limited thereto. In some example embodiments, the receiving module 309 may receive the one or more signals of the plurality of array signals that may be routed to one or more segments of the plurality of segments of the left memory array 205 and/or the right memory array 207, based on a unique load value desired and/or predefined for each of the plurality of driver units (e.g., a unique address, etc., for each of the driver units). Further, the plurality of driver units are communicatively connected to the plurality of segments through a corresponding plurality of metal control lines for routing array signals, etc. In other words, each driver unit of the central driver 203 is configured to and/or pre-configured to carry a dedicated load and/or desired set of signal(s) to the corresponding segment to which the driver unit is connected. The central driver 203 receives one or more of the plurality of array signals based on the desired and/or pre-configured dedicated load and/or desired set of signals, and each of the driver units carry the dedicated load and/or desired set of signals to its respective segment. In some example embodiments, the plurality of metal control lines (in other words, the metallic wires, etc.) may be used at each metallic layer (e.g., metal layer), that route the one or more array signals of the plurality of array signals driven by each of the plurality of driver units to the plurality of columns of memory bit cells of the corresponding plurality of segments through the corresponding plurality of metal control lines in the left memory array 205 and/or the right memory array 207, etc. As an example, consider driver unit 1 is connected to segment 1 via metal control lines of the metallic layer M2, and that the driver unit 1 is desired and/or preconfigured with a dedicated unique load value of "X" (e.g., a memory address "X"). Therefore, upon receiving the one or more array signals of the plurality of array signals at the central driver 203, the driver unit 1 may pick the one or more array signals of the plurality of array signals addressed for the dedicated unique load value "X" (e.g., memory address "X") to route to segment 1 via the metal control lines of the metallic layer M2, etc., but the example embodiments are not limited thereto.

In some example embodiments, the routing module 310 may route the one or more array signals of the plurality of array signals driven by each of the plurality of driver units to the plurality of columns of memory bit cells of the corresponding plurality of segments through corresponding plurality of metal control lines, but the example embodiments are not limited thereto. In some example embodiments, the driver units that carry, transmit, and/or drive the array signals through the plurality of metal control lines arranged at higher metallic layer routes to the plurality of columns of memory bit cells of the corresponding segment by tapping through each of the plurality of metal control lines at lower metallic layers in an ascending manner Thus, conductivity of each of the plurality of metal control lines varies based on the distance of each of the plurality of segments from the central driver 203 and/or a metallic layer of the metal control line, etc.

Figure 4A:
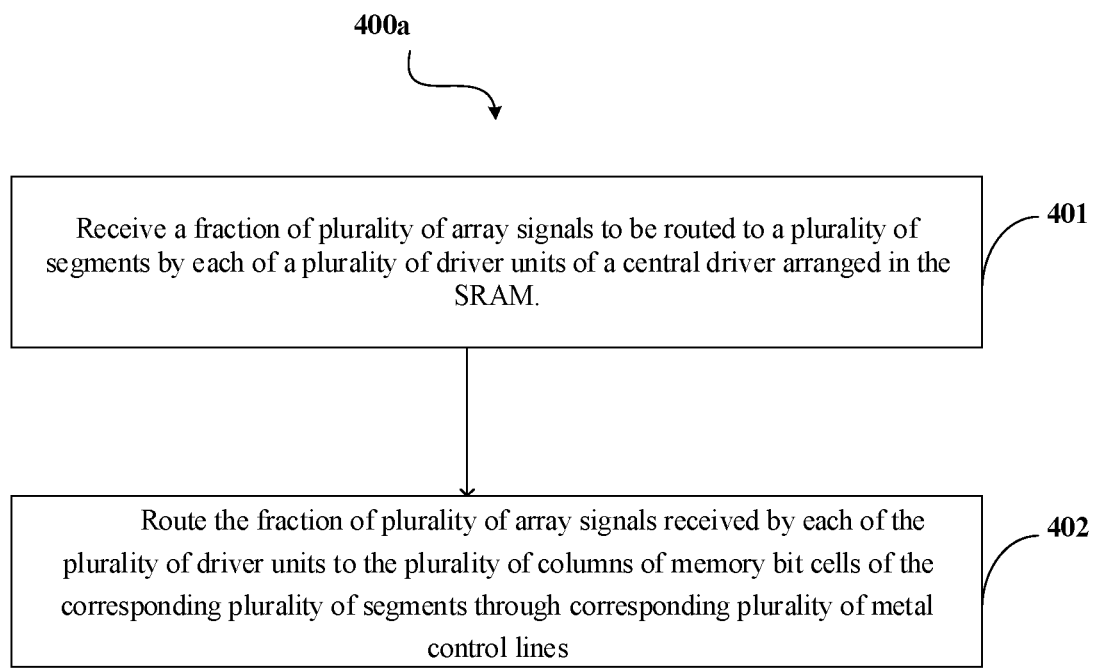
FIG. 4A shows a flowchart illustrating a method of operating the SRAM apparatus for reducing wire delay, in accordance with some example embodiments of the inventive concepts.

FIG. 4A shows a flowchart illustrating a method of operating the SRAM apparatus for reducing wire delay, in accordance with some example embodiments of the inventive concepts.

As illustrated in FIG. 4A, the method 400a includes one or more blocks and/or operations illustrating a method for reducing wire delay while operating an SRAM apparatus.

The order in which the operations of the method 400a is described is not intended to be construed as a limitation, and any number of the described method blocks (e.g., operations) may be combined in any order to implement the method 400a. Additionally, individual blocks and/or operations may be deleted and/or omitted from the methods without departing from the spirit and scope of the example embodiments of the inventive concepts described herein. Furthermore, the method 400a may be implemented using suitable hardware, and/or a combination of hardware and software, hardware and firmware, such as processing circuitry controlling SRAM fabrication machinery and/or processes, etc.

At operation 401, the method 400a may include receiving, by each of a plurality of driver units of a central driver 203 arranged and/or included in the SRAM apparatus 201, one or more of (e.g., a fraction of, a subset of, etc.) a plurality of array signals to be routed to a plurality of segments of the left memory array 205 and/or the right memory array 207, based on a unique load value desired and/or predefined for each of the plurality of driver units, etc. In some example embodiments, a plurality of columns of memory bit cells of the left memory array 205 and the right memory array 207 are divided into a plurality of segments, and each of the plurality of segments comprises the plurality of memory bit cells, etc.

At operation 402, the method 400a may include routing, by each of the plurality of driver units of the central driver 203, the one or more array signals (e.g., the fraction, the subset, etc.) of the plurality of array signals driven by each of the plurality of driver units to the plurality of columns of memory bit cells of the corresponding plurality of segments through a corresponding plurality of metal control lines, etc. Each of the plurality of metal control lines is arranged at different metallic (e.g., metal) layers of the SRAM apparatus, etc. In some example embodiments, the plurality of array signals carried by a metal control line of the plurality of metal control lines, arranged at a higher metallic layer, is routed to the plurality of columns of the memory bit cells of corresponding segment by tapping through each of the plurality of metal control lines at lower metallic layers compared to the higher metallic layers, in a descending manner, but the example embodiments are not limited thereto.

Figure 4B:
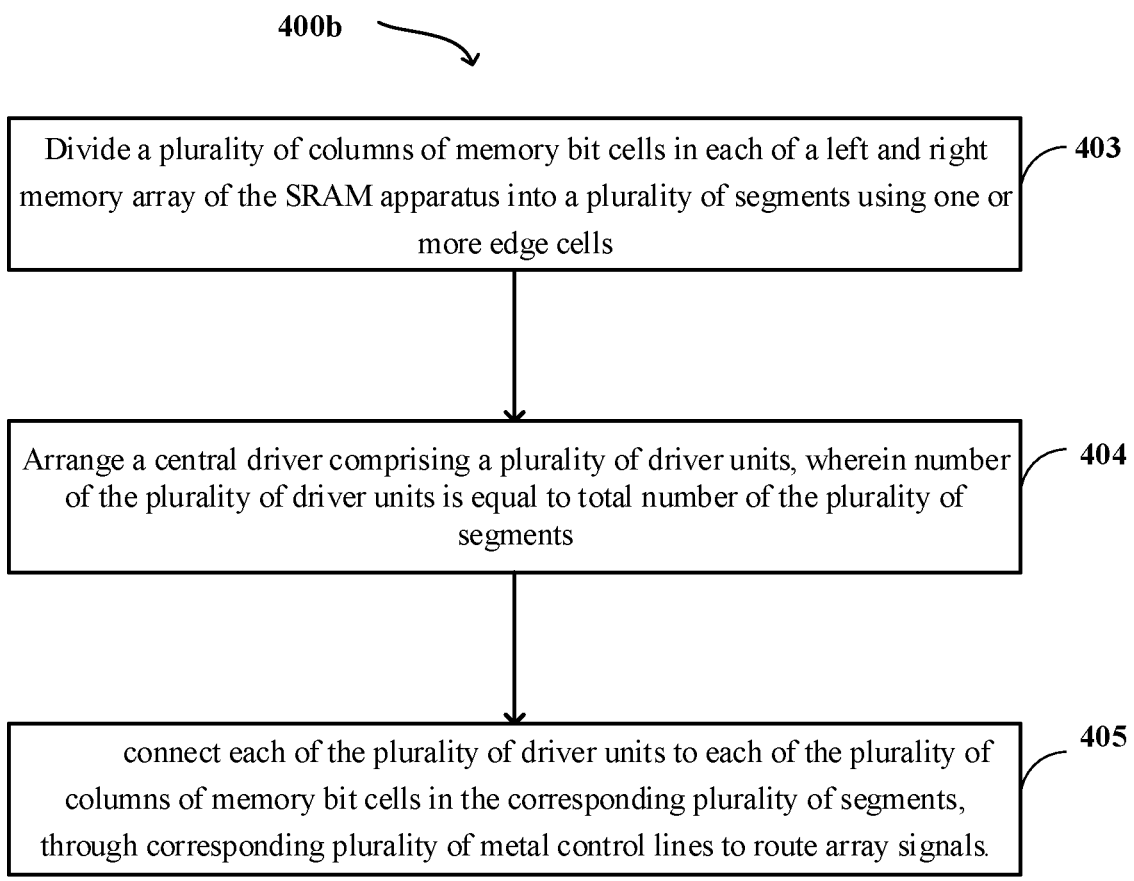
FIG. 4B shows a flowchart illustrating a method of designing the SRAM apparatus, in accordance with some example embodiments of the inventive concepts.

FIG. 4B shows a flowchart illustrating a method of designing an SRAM apparatus, in accordance with some example embodiments of the inventive concepts.

As illustrated in FIG. 4B, the method 400b includes one or more operations and/or blocks illustrating a method of designing an SRAM apparatus 201 for reducing wire delay, but the example embodiments are not limited thereto.

The order in which the operations of the method 400b is described is not intended to be construed as a limitation, and any number of the described method operations and/or blocks may be combined in any order to implement the method 400b. Additionally, individual operations and/or blocks may be deleted from the methods without departing from the spirit and scope of the example embodiments of the inventive concepts. Furthermore, the method 400b may be implemented in suitable hardware, hardware and software, hardware and firmware, etc., such as processing circuitry executing SRAM design software, etc.

At operation 403, the method 400b may include dividing a plurality of columns of memory bit cells in each of a left memory array 205 and a right memory array 207 of the SRAM apparatus 201 into a plurality of segments using one or more edge cells, etc.

At operation 404, the method 400b may include arranging a central driver 203 comprising a plurality of driver units, wherein the number of driver units included in the plurality of driver units is equal to the total number of the plurality of segments, but is not limited thereto.

At operation 405, the method 400b may include connecting each of the plurality of driver units to each of the plurality of columns of memory bit cells in the corresponding plurality of segments, through a corresponding plurality of metal control lines to route array signals.

The example embodiments of the inventive concepts aims at reducing the wire delay in a SRAM device. A central driver 203 of the SRAM apparatus 201 may include a plurality of driver units equal to a total number of the plurality of segments in the SRAM apparatus 201 to route the array signals. Hence, the amount of load on each of the metallic wire becomes less. As a result, one or more of the example embodiments of the inventive concepts achieve better word line slew rate and/or reduces delay in the transmission of the array signals, etc. Performance of SRAM devices of the at least one example embodiment may be improved by 5-7% in comparison to conventional SRAM devices, but the example embodiments are not limited thereto.

A description of an example embodiment with several components in communication with each other does not imply that all such components are desired and/or required. On the contrary a variety of optional components are described to illustrate the wide variety of possible example embodiments of inventive concepts.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other example embodiments of inventive concepts need not include the device itself.

Various example embodiments of a SRAM apparatus with a reduced wire delay, a method of operating the SRAM apparatus, and/or a method of designing the SRAM apparatus, etc., are described herein. The illustrated operations are set out to explain the example embodiments shown, but the example embodiments are not limited thereto. These example embodiments are presented herein for purposes of illustration, and not limitation. Further, the boundaries of the functional building blocks have been arbitrarily defined herein for the convenience of the description. Alternative boundaries may be defined so long as the specified functions and relationships thereof are appropriately performed. Alternatives (including equivalents, extensions, variations, deviations, etc., of those described herein) will be apparent to persons of ordinary skill in the relevant art(s) based on the teachings contained herein. Such alternatives fall within the scope and spirit of the disclosed example embodiments. Also, the words "comprising," "having," "containing," and "including," and other similar forms are intended to be equivalent in meaning and be open ended in that an item or items following any one of these words is not meant to be an exhaustive listing of such item or items or meant to be limited to only the listed item or items. It must also be noted that as used herein and in the appended claims, the singular forms "a," "an," and "the" include plural references unless the context clearly dictates otherwise.

Finally, the language used in the specification has been principally selected for readability and instructional purposes, and it may not have been selected to delineate or circumscribe the inventive concepts. It is therefore intended that the scope of the inventive concepts be limited not by this detailed description, but rather by any claims that issue on an application based here on. Accordingly, the example embodiments of the inventive concepts are intended to be illustrative, but not limiting, of the scope of the inventive concepts, which is set forth in the following claims.

REFERENCE NUMERALS

| Reference Number | Description |
| --- | --- |
| 200 | Architecture |
| 201 | SRAM apparatus |
| 203 | Central driver |
| 205 | Left memory array |
| 207 | Right memory array |
| 301 | Data |
| 302 | Memory |
| 303 | Input data |
| 305 | Other data |
| 307 | Memory Controller |
| 309 | Receiving Module |
| 310 | Routing Module |
| 311 | Other modules |

We claim:

1. A Static Random-Access Memory (SRAM) apparatus for reducing wire delay, the apparatus comprising:
   a left memory array and a right memory array, each comprising a plurality of columns, the plurality of columns in each of the left memory array and the right memory array divided into a plurality of segments, each of the segments comprising a plurality of memory bit cells, the plurality of columns in each of the left memory array and the right memory array are divided into the plurality of segments using one or more edge cells; and
   central driver circuitry between the left memory array and the right memory array, the central driver circuitry comprising a plurality of driver devices, each of the plurality of driver devices communicatively connected to a corresponding segment of the plurality of segments through a corresponding metal control line of a plurality of metal control lines, the central driver circuitry configured to route at least one array signal to at least one segment of the plurality of segments, wherein the one or more edge cells are not connected to any metal control lines of the plurality of metal control lines.

2. The SRAM apparatus as claimed in claim 1, wherein
each metal control line of the plurality of metal control lines is arranged at one of a plurality of metallic layers of the SRAM apparatus; and
each metal control line of the plurality of metal control lines is connected to one of the corresponding plurality of segments based on a distance of the segment from the central driver circuitry.

3. The SRAM apparatus as claimed in claim 1, wherein
the plurality of metal control lines at a higher metallic layer of a plurality of metallic layers are connected to the plurality of columns of the corresponding segment through the plurality of metal control lines in at least one lower metallic layer of the plurality of metallic layers via taps; and
the central driver circuitry is further configured to:
route the at least one array signal to the plurality of columns of the corresponding segment of the plurality of segments through the corresponding metal control line of the plurality of metal control lines.

4. The SRAM apparatus as claimed in claim 1, wherein
for each metal control line of the plurality of metal control lines, a thickness of the metal control line is based on a distance of a respective segment of the plurality of segments corresponding to the metal control line from the central driver circuitry and a metallic layer of the metal control line.

5. The SRAM apparatus as claimed in claim 1, wherein
for each metal control line of the plurality of metal control lines, a conductivity of the metal control line is based on a distance of a respective segment of the plurality of segments corresponding to the metal control line from the central driver circuitry and a metallic layer of the metal control line.

6. A method of operating a Static Random-Access Memory (SRAM) apparatus, wherein the SRAM apparatus comprises a left memory array and a right memory array, the left memory array and the right memory array both including a plurality of columns, the plurality of columns in each of the left memory array and the right memory array are divided into a plurality of segments using one or more edge cells, the method comprising:
receiving, by each of a plurality of driver devices included in central driver circuitry included in the SRAM apparatus, the central driver circuitry between the left memory array and the right memory array, a subset of array signals of a plurality of array signals to be routed to at least one segment of the plurality of segments of the left memory array and the right memory array, based on a unique load value of a plurality of unique load values, each of the unique load values corresponding to a driver device of the plurality of driver devices; and
routing, by each of the plurality of driver devices, the subset of array signals driven by each of the plurality of driver devices to the plurality of columns of a corresponding segment of the plurality of segments through a corresponding metal control line of a plurality of metal control lines, wherein the one or more edge cells are not connected to any metal control lines of the plurality of metal control lines.

7. The method as claimed in claim 6, wherein
each segment of the plurality of segments comprises a plurality of memory bit cells.

8. The method as claimed in claim 6, wherein
each metal control line of the plurality of metal control lines is arranged at one of a plurality of metallic layers of the SRAM apparatus;
the plurality of metal control lines at higher metallic layers of the plurality of metallic layers are connected to the plurality of columns of the corresponding segment through the plurality of metal control lines at lower metallic layers of the plurality of metallic layers via taps; and
the method further comprises routing the subset of array signals to the plurality of columns of corresponding segment through the corresponding plurality of metal control lines.

9. The method as claimed in claim 6, wherein
each metal control line of the plurality of metal control lines is connected to one of the corresponding plurality of segments based on a distance of the segment from the central driver circuitry.

10. The method as claimed in claim 6, wherein
for each metal control line of the plurality of metal control lines, a thickness of the metal control line is based on a distance of a respective segment of the plurality of segments corresponding to the metal control line from the central driver circuitry and a metallic layer of the metal control line.

11. The method as claimed in claim 6, wherein
for each metal control line of the plurality of metal control lines, a conductivity of the metal control line is based on a distance of a respective segment of the plurality of segments corresponding to the metal control line from the central driver circuitry and a metallic layer of the metal control line.

12. A method of designing a Static Random-Access Memory (SRAM) apparatus for reducing wire delay, the method comprising:
dividing, using processing circuitry, a plurality of columns in each of a left memory array and a right memory array of the SRAM apparatus into a plurality of segments using one or more edge cells;
arranging, using the processing circuitry, central driver circuitry comprising a plurality of driver devices, the central driver circuitry between the left memory array and the right memory array, wherein a total number of the plurality of driver devices is equal to a total number of the plurality of segments, the central driver circuitry configured to route a plurality of array signals; and
connecting, using the processing circuitry, each of the plurality of driver devices to each column of the plurality of columns included in a corresponding segment of the plurality of segments, through at least one corresponding metal control line of a plurality of metal control lines, wherein the one or more edge cells are not connected to any metal control lines of the plurality of metal control lines.

13. The method as claimed in claim 12, wherein
the plurality of metal control lines at a higher metallic layer of a plurality of metallic layers are connected to the plurality of columns of the corresponding segment through the plurality of metal control lines in at least one lower metallic layer of the plurality of metallic layers via taps; and
the method further includes:
routing the plurality of array signals to the plurality of columns of the corresponding segment of the plurality of segments through the corresponding metal control line of the plurality of metal control lines.

14. The method as claimed in claim 12, wherein
for each metal control line of the plurality of metal control lines, a thickness of the metal control line is based on a distance of a respective segment of the plurality of segments corresponding to the metal control line from the central driver circuitry and a metallic layer of the metal control line.

15. The method as claimed in claim 12, wherein
for each metal control line of the plurality of metal control lines, a conductivity of the metal control line is based on a distance of a respective segment of the plurality of segments corresponding to the metal control line from the central driver circuitry and a metallic layer of the metal control line.

* * * * *